United States Patent
Chia et al.

[11] Patent Number: 6,002,169
[45] Date of Patent: Dec. 14, 1999

[54] THERMALLY ENHANCED TAPE BALL GRID ARRAY PACKAGE

[75] Inventors: Chok J. Chia, Cupertino; Seng-Sooi Lim, San Jose; Owai H. Low, Cupertino, all of Calif.

[73] Assignee: LSI Logic Corporation, Milpitas, Calif.

[21] Appl. No.: 09/097,883

[22] Filed: Jun. 15, 1998

[51] Int. Cl.⁶ .......................... H01L 23/48; H01L 23/12; H01L 23/053

[52] U.S. Cl. .......................... 257/697; 257/693; 257/701; 257/707

[58] Field of Search .................... 257/697, 693, 257/701, 678, 707; 228/180.22

[56] References Cited

U.S. PATENT DOCUMENTS

| | | | |
|---|---|---|---|
| 5,241,133 | 8/1993 | Mullen, III et al. | 257/693 |
| 5,455,456 | 10/1995 | Newman | 257/704 |
| 5,569,879 | 10/1996 | Gloton et al. | 174/52.2 |
| 5,602,059 | 2/1997 | Horiuchi et al. | 438/613 |
| 5,640,047 | 6/1997 | Nakashima | 257/738 |
| 5,672,912 | 9/1997 | Aoki et al. | 257/693 |
| 5,729,051 | 3/1998 | Nakamura | 257/668 |
| 5,760,465 | 6/1998 | Akoe et al. | 257/669 |
| 5,841,192 | 11/1998 | Exposito | 257/701 |
| 5,866,942 | 2/1999 | Suzuki et al. | 257/698 |
| 5,882,957 | 3/1999 | Lin | 438/613 |

*Primary Examiner*—Mahshid Saadat
*Assistant Examiner*—Jhihan B. Clark

[57] ABSTRACT

A semiconductor package (110) includes a tape substrate (135) having a top surface, a bottom surface, a plurality of conductive metal traces (115) formed on the top surface and a plurality of holes (130) arraigned in an array pattern formed through the tape substrate (135) exposing the conductive traces (115) from the bottom surface. A nonconductive metal plate or stiffener frame (155) attached to the bottom surface of the tape substrate (135) to support the tape substrate (135) during assembly. The stiffener frame (155) having through holes (160) corresponding to the holes (130) in the tape substrate (135) and being made from anodized aluminum, thus making it electrically nonconductive. An integrated circuit (IC) chip (120) is mounted on the top surface, opposite the stiffener frame (155). The IC chip (120) is in electrical connection to the traces (115) and a plurality of solder balls (125) are attached to the traces (115) through the holes (130 and 160), electrically connecting the semiconductor package (110) to a printed circuit board (170). Along with providing support for the tape substrate (135) during assembly, the stiffener frame (155) is used to improve the thermal performance of the semiconductor package (110) by dissipating the heat generated by the IC die (120) and improving the flatness of the finished semiconductor package (110).

9 Claims, 1 Drawing Sheet

THERMALLY ENHANCED TAPE BALL GRID ARRAY PACKAGE

BACKGROUND OF THE INVENTION

The present invention relates to a semiconductor package and method of packaging a tape ball grid array (TBGA) package, e.g., an integrated circuit, and more particularly to a TBGA package wherein an anodized aluminum frame is used to serve the dual purpose of supporting the tape automated bonding (TAB) substrate during assembly and dissipating heat generated by the integrated circuit chip in the semiconductor package.

In the last few decades, the electronics industry has literally transformed the world. Electronic products are used by, or affect the daily lives of, a large segment of the world's population. For example, telephones, television, radios, Personal Computers (PCS), laptop PCS, palmtop PCS, PCS with built-in portable phones, cellular phones, wireless phones, pagers, modems, and video camcorders, are just a few of the electronic products that have been developed in recent years and which have been made smaller and more compact, while providing more and/or enhanced functions than ever before. The integrated circuit (IC) chip, and the more efficient packaging of the IC chip, have played a key role in the success of these products.

The IC chip, sometimes referred to as the IC "die", contains embedded electronic circuitry that performs, at least in part, the electrical/electronic functions for the particular electronic device wherein the IC chip is used. The IC chip, however, is not an isolated island. It must communicate with other chips in a circuit through an Input/Output (I/O) system of electrical interconnections, or "interconnects". Moreover, the IC chip and its embedded circuitry are delicate, and must therefore be protected in a package that can both carry and protect it. As a result, the major functions of the IC package are: (1) to provide a path for the electrical current that powers the circuits on the chip; (2) to distribute the signals on to and off of the chip; (3) to remove the heat generated by the circuit; and (4) to support and protect the chip from hostile environments.

Integrated circuits are typically housed within a package that is mounted to a printed circuit board (PCB) or printed wiring board (PWB). An integrated circuit substrate is used to connect the IC chip to the PCB. One popular group of packages is the Grid Array package, which consists of an IC substrate for mounting and interconnecting the IC chip to the electronic package such as a printed circuit board. On the top surface of the IC substrate, an IC chip is mounted and electrically connected to traces that are formed on the top surface of the IC substrate. On the bottom surface of the IC substrate, pins or solder balls are mounted in an array pattern for connection of the electronic package.

The IC chip is typically attached in the center of the IC substrate. Wires are used to connect a plurality of contact pads on the IC chip to lands on the IC substrate. The lands are typically the ends of the traces nearest the IC chip. The lands are in turn connected to the array of pins or balls on the opposite surface on the IC substrate by holes (also known as "vias") through the IC substrate.

The substrate can be made from different materials such as ceramic, plastic or tape. This invention focuses on the tape substrate. The tape substrate, commonly called tape automated bonding (TAB), is used to wire IC chips when extreme package thinness is required, such as in a credit card size radio. Various methods are used to form the TAB that are known in the art. One type of package is a tape ball grid array (TBGA) package 10, shown in FIG. 1, that consists of a tape substrate 35 with metal circuitry etched on a top surface creating traces 15, typically made of copper, interconnecting the IC chip 20 and the solder balls 25. Holes 30 are formed in the tape substrate 35 material for attaching the solder balls 25 to the traces 15. Wire bonding 40 is used to connect the IC chip pads to the traces 15 and the assembly is encapsulated with plastic encapsulant 45 for protection. Disadvantageously, handling the TBGA package during assembly is very difficult due to the thinness of the package and the flexibility of the tape substrate 35.

Another disadvantage with the TBGA package 10 is that it is very poor at heat dissipation. There is no thermally conductive metal structure attached to the IC chip 20 to dissipate the heat generated by the IC chip 20. An optional heatspreader 50 may be attached to the TBGA package 10 to dissipate heat, as shown in FIG. 1. The heatspreader 50 typically comprises a planar thermally-conductive element, such as a sheet of metal, that is located above the IC chip 20 and attached to it by the encapsulant 45. Thus, heat generated in the IC chip 20 by operation of the circuits embedded therein is conducted through the encapsulant 45 to the heatspreader 50, where it is dissipated, thereby helping maintain the junction temperatures of the semiconductor devices included within the circuits of the IC chip 20 at safe operating levels. Disadvantageously, this method is not thermally efficient because the encapsulant does not conduct heat efficiently. The heatspreader also adds cost and increases the thickness of the TBGA package.

In view of the above, it is evident that what is needed is a support structure for a tape ball grid array (TBGA) package that can be used during assembly for ease of handling and will also improve the thermal performance of the package by efficiently dissipating heat generated by the IC chip.

SUMMARY OF THE INVENTION

The present invention addresses the above and other needs by providing a semiconductor package, e.g., a tape ball grid array package (TBGA) package, wherein a support structure is provided to support the tape substrate during assembly and improve the thermal performance of the TBGA by dissipating the heat generated by the integrated circuit (IC) chip.

The semiconductor package includes a tape substrate with metal circuitry etched on top surface creating traces, typically made of copper. Holes are etched or punched or otherwise formed in the tape substrate material in an array pattern matching an array pattern on a printed circuit board on which the semiconductor package will mount. A stiffener member is laminated to a lower surface of the tape substrate. The stiffener member has a plurality of through holes formed therein corresponding to the holes in the tape substrate. The stiffener member is typically fabricated from aluminum that has been anodized to form a protective, insulative, aluminum oxide coating thereon. An IC chip is attached to a top surface of the tape substrate, opposite the stiffener member. The IC chip is electrically connected to the traces with wire bonds. Solder balls are attached to the traces through the holes in the substrate and stiffener member for attachment of the package to the printed circuit board.

Using an anodized aluminum stiffener frame within the semiconductor package offers several advantages. First, aluminum is light and strong, adding needed support for the thin tape substrate during assembly and improving the flatness of the assembled semiconductor package. This added support and flatness significantly improves the yield and fabricating time associated with the manufacture of the package, thus proving less expensive. Second, the aluminum stiffener frame is able to conduct heat away from the IC chip in an efficient manner. Therefore, the reliability of the semiconductor package is improved with the heat dissipating stiffener frame in place. Third, the overall height of the semiconductor package is less than if an external heatspreader were added, which lowers the cost due to the elimination of the heatspreader.

Thus, through the use of an anodized aluminum stiffener frame within the semiconductor package in accordance with the present invention, a semiconductor package is provided that is more reliable, less expensive, and provides improved thermal performance, than has heretofore been achievable using an external heatspreader as is common in the prior art.

BRIEF DESCRIPTION OF THE DRAWINGS

The above and other aspects, features and advantages of the present invention will be more apparent from the following more particular description thereof, presented in conjunction with the following drawings wherein.

Below is a list of reference numbers associated with the figures.

| No. | Component |
|---|---|
| 10 | Tape Ball Grid Array Package |
| 15 | Traces |
| 20 | Integrated Circuit Chip or Die |
| 25 | Solder Balls |
| 30 | Holes in Substrate 35 |
| 35 | Tape Substrate |
| 40 | Wire Bonding |
| 45 | Encapsulant |
| 50 | Heatspreader |
| 110 | Tape Ball Grid Array Package |
| 115 | Traces |
| 116 | Bond Pad |
| 117 | Solder Ball Pad |
| 120 | Integrated Circuit Chip or Die |
| 121 | Active Surface of IC Chip 120 |
| 122 | Non-Active Surface of IC Chip 120 |
| 123 | IC Chip Contact Pads |
| 124 | IC Mounting Area |
| 125 | Solder Balls |
| 130 | Holes in Substrate 135 |
| 135 | Tape Substrate |
| 140 | Wire Bonding |
| 145 | Encapsulant |
| 155 | Stiffener Frame |
| 160 | Through Holes in Stiffener Frame 155 |
| 170 | Printed Circuit Board |
| 175 | Adhesive |

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

Figure 1:
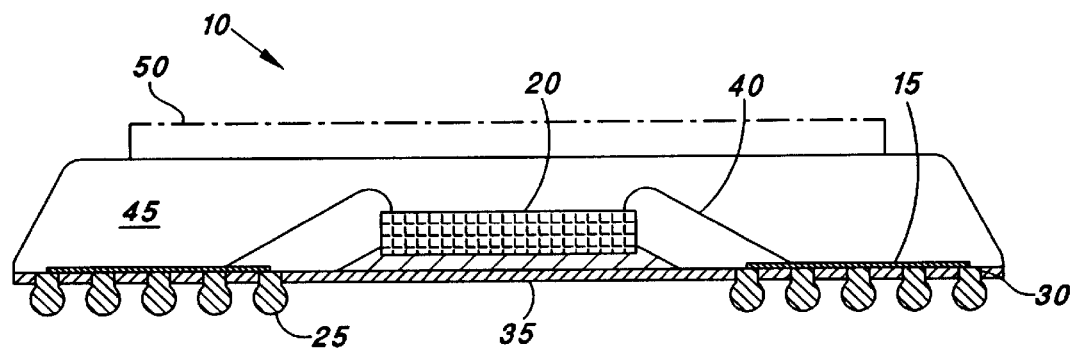
FIG. 1 is a sectional view of a tape ball grid array (TBGA) package of the prior art.

FIG. 1 has been explained previously in the Background Section of the application.

Figure 2:
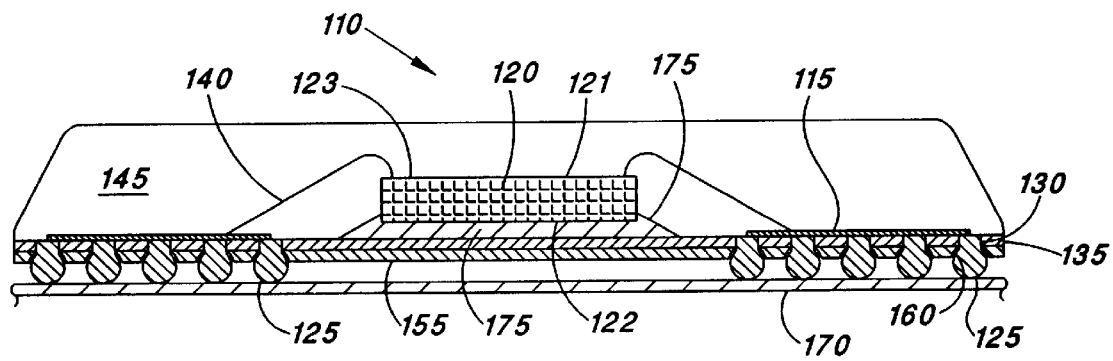
FIG. 2 is a sectional view of a thermally enhanced tape ball grid array (TBGA) package in accordance with the present invention.
Figure 3:
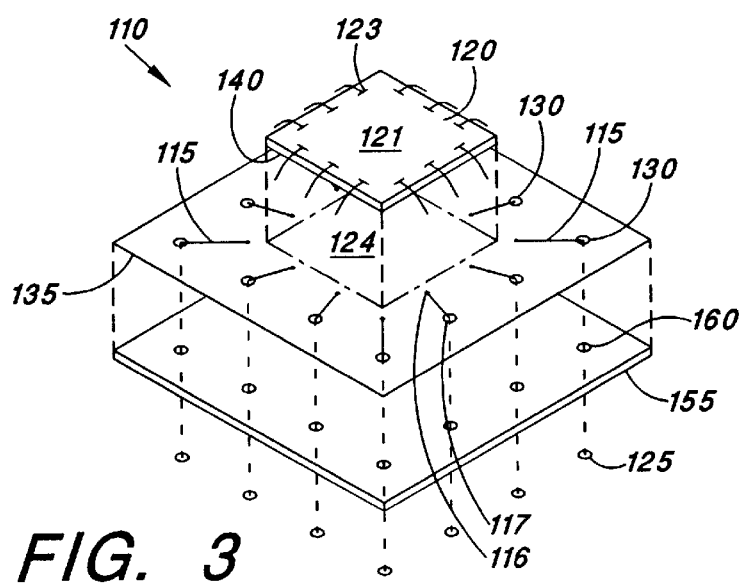
FIG. 3 is an simple exploded view showing a simple thermally enhanced tape ball grid array (TBGA) package in accordance with the present invention.

FIG. 2 is a sectional view of a semiconductor package 110 referred to as a tape ball grid array (TBGA) package made in accordance with the invention while FIG. 3 shows an exploded view of a TBGA in simplistic form to show the relationship between the components. The package 110 includes a tape substrate 135 having a plurality of traces 115 formed on the top surfaces with a plurality of holes 130 arraigned in an array pattern matching an array pattern on a printed circuit board 170 on which the semiconductor package 110 will mount. A stiffener frame 155, with a plurality of through holes 160 matching the array pattern of the holes 130, is laminated to the lower surface of the tape substrate 135 to provide support during the assembly of the package. The stiffener frame 155 is made of electrically nonconductive and thermally conductive material. An integrated circuit (IC) chip 120 is mounted on the top surface of the tape substrate 135 and wire bonding 140 is used to connect IC chip 120 to the top surface of the traces 115, in conventional manner. Solder balls 125 are connected to the traces 115 through the hole 130 and through hole 160. The assembly is encapsulated with plastic encapsulant 145 for protection.

The formation of the tape substrate 135, commonly referred to as tape automated bonding (TAB), starts with the formation of the lead system or traces 115 on a flexible strip of tape 135 by laminating, sputtering, or plating copper metal on the top surface of the tape. Typically, the tape 135 is made of a flexible plastic, such as Kapton, and is about 5 mils (0.005 inches) thick. Formation of the copper traces 115 on the surface of the tape 135 is accomplished by patterning or mechanically stamping the copper to form electrical connections from the bond pads 116 (the end of the trace 115 nearest the IC mounting area 124) to the solder ball pads 117 (the end of the trace 115 nearest the hole 130 or via), as shown in FIG. 3. Holes 130 are formed in the tape substrate 135 (by etching, punching or other means) to correspond to the array pattern on the printed circuit board 170. While the present invention describes a tape substrate, other substrate materials may also be used such as laminate or ceramic material.

In accordance with the present invention, the stiffener frame 155 is laminated to the lower surface of the tape substrate 135 using an adhesive. A plurality of through holes 160 are made in the stiffener frame 155 to match the holes 130 in the tape substrate 135. The purpose of the through-holes 160 is to allow the solder balls 125 to extend therethrough so that an electrical connection can be established with the solder ball pads 117 of the traces 115. The stiffener frame 155 is preferably made from an aluminum sheet which has been anodized to form an oxide layer thereon, having a thickness of around 10 mils (0.010 inches). Other materials having properties similar to anodized aluminum could also be used. The stiffener frame 155 also improves the flatness of the package 110.

The IC chip 120 has an active surface 121 (upper surface as oriented in FIG. 2) and a non-active surface 122 (lower surface as oriented in FIG. 2). The non-active surface 122 of the IC chip 120 is bonded to the top surface of the substrate with a layer of adhesive 175, opposite the stiffener frame 155. The closeness of the IC chip 120 to the stiffener frame 155 allows thermal heat transfer through the thin tape substrate 135 from the IC chip 120 to the stiffener frame 155. This allows the stiffener frame 155 to dissipate heat like a heatspreader. The active surface 121 of the IC chip 120 includes a plurality of contact pads 123 thereon through which electrical contact is made with the electronic circuits that are embedded within the IC chip 120. Typically, these contact pads 123 are located along the edges of the chip 120.

Bonding wires 140 connect each contact pad 123 of the IC chip 120 to respective traces 115 on the tape substrate 135. Such bonding wires 140 are typically made from gold and connect the contact pads 123 of the IC chip 120 to the traces 115 of the substrate 135 using spot welds, as is known in the art. Solder balls 125 are attached to the traces 115 through the holes 130 and through holes 160. Such connection thus allows each contact pad 123 of the IC chip 120 to be electrically connected with a corresponding solder ball 125 of the package 110.

The manner of anodizing the aluminum stiffener frame 155 is known in the art. Such anodization is typically realized through an anodic process performed in a suitable electrolyte with the aluminum as the anode. Anodization of aluminum is typically carried out using an electrolyte such as chromic acid or sulfuric acid, but other electrolytes may also be used.

Advantageously, the layer of aluminum oxide that results from the anodization process is typically a different color than is pure aluminum, thereby facilitating visual confirmation of the formation of the oxide layer. Moreover, for cosmetic purposes, the color of the anodization oxide layer may be selected to be a desired color, e.g., black, gray, or blue. Such layer advantageously provides a protective and insulative coating for the aluminum. This protective and insulative coating further allows the support anodized aluminum stiffener frame 155 to be electrically nonconductive.

Additionally, the anodized aluminum stiffener frame 155 is thermally conductive. This allows the anodized aluminum stiffener frame 155 to act as a heatspreader for the IC chip 120. During operation, the IC chip 120 generates heat. This heat is transferred through the thin tape substrate 135 to the anodized aluminum stiffener frame 155. Since the anodized aluminum stiffener frame 155 is elevated off the printed circuit board 170 by the distance of the solder balls 125, some air may flow between the printed circuit board 170 and the aluminum stiffener frame 155, and by thermal convection, conduct the heat away from the anodized aluminum stiffener frame 155.

As indicated previously, using an anodized aluminum stiffener frame 155 within a semiconductor package 110 in accordance with the present invention offers several advantages. First, aluminum is light weight and strong, adding needed support for the thin tape substrate 135 during assembly and improving the flatness of the assembled package 110, thereby significantly improving the yield achieved with the manufacture of the package. Second, the aluminum stiffener frame 155 is able to conduct heat away from the IC chip 120 in an efficient manner. Therefore, the reliability of the semiconductor package 110 is improved with the heat dissipating stiffener frame 155 in place. Third, the overall height of the semiconductor package 110 is less than if an external heatspreader were added, which lowers the cost due to the elimination of the heatspreader cost a associated labor.

Thus, it is seen that by using an anodized aluminum stiffener frame 155 within a semiconductor package 110 in accordance with the present invention, a semiconductor package 110 is provided that is more reliable, less expensive, and provides improved thermal performance, than has heretofore been achievable using an external heatspreader as is common in the prior art.

While the invention herein disclosed has been described by means of specific embodiments and applications thereof, numerous modifications and variations could be made thereto by those skilled in the art without departing from the scope of the invention set forth in the claims.

What is claimed is:

1. A thermally enhanced tape ball grid array package comprising:

a tape substrate having a top surface and a bottom surface with an integrated circuit (IC) chip attach area on the top surface;

a plurality of conductive metal traces formed on the top surface of the tape substrate;

a plurality of holes arranged in an array pattern formed through the tape substrate exposing the conductive traces;

a nonconductive stiffener frame attached to the bottom surface of the tape substrate, the stiffener frame having through-holes corresponding to the holes in the tape substrate;

an IC chip mounted on the tape substrate;

means for making electrical connection between the IC chip and the traces; and a plurality of solder balls attached to the traces exposed through the through-holes of the stiffener frame and the holes in the tape substrate, thereby providing a means for electrically connecting the package to a printed circuit board.

2. The package of claim 1 wherein said tape substrate is made of Kapton.

3. The package of claim 1 wherein said plurality of conductive traces are made of conductive metal.

4. The package of claim 1 wherein said means for making electrical connection between the IC chip and the traces is wire bonds.

5. The package of claim 1 wherein said nonconductive stiffener frame is anodized aluminum.

6. The package of claim 1 wherein said electrical connection between the IC chip and the traces is a wire bond.

7. The package of claim 3 wherein said conductive metal is copper.

8. The package of claim 6 further including an encapsulant disposed on the top surface of the tape substrate covering the IC chip and wire bonds.

9. A stiffener frame for use in a tape ball grid array package, the stiffener frame mounted on a bottom side of a tape substrate, a semiconductor chip mounted on a top side of the tape substrate opposite the stiffener frame, the stiffener frame comprising aluminum that has been anodized to form a protective, insulative, aluminum oxide coating thereon, the stiffener frame being in thermal contact with the semiconductor chip such that the stiffener frame dissipates heat generated by the semiconductor chip.

* * * * *